United States Patent [19]
Fossum et al.

[11] Patent Number: 5,386,128
[45] Date of Patent: Jan. 31, 1995

[54] MONOLITHIC IN-BASED III-V COMPOUND SEMICONDUCTOR FOCAL PLANE ARRAY CELL WITH SINGLE STAGE CCD OUTPUT

[75] Inventors: Eric R. Fossum, La Crescenta; Thomas J. Cunningham, Pasadena; Timothy N. Krabach, Valencia; Craig O. Staller, Tujunga, all of Calif.

[73] Assignee: The United States of America as represented by the Administrator of the National Aeronautics and Space Administration, Washington, D.C.

[21] Appl. No.: 186,185

[22] Filed: Jan. 21, 1994

[51] Int. Cl.$^6$ .................... H01L 29/78; H01L 27/14; H01L 31/00

[52] U.S. Cl. .................... 257/183.1; 257/187; 257/189; 257/233; 257/239; 257/258; 257/279

[58] Field of Search ............ 257/183.1, 184, 187, 257/189, 231, 232, 233, 234, 239, 257, 258, 279, 291, 292

[56] References Cited

U.S. PATENT DOCUMENTS

| | | | |
|---|---|---|---|
| 3,945,110 | 3/1976 | Hunsperger et al. | 29/572 |
| 4,188,709 | 2/1980 | Lorenze, Jr. et al. | 29/577 |
| 4,257,057 | 3/1981 | Chenng et al. | 257/183.1 |
| 4,380,755 | 4/1983 | Endlicher et al. | 257/231 |
| 4,416,053 | 11/1983 | Figueroa et al. | 29/572 |
| 4,532,699 | 8/1985 | Bourdillot et al. | 29/572 |
| 4,612,454 | 9/1986 | Kinoshita et al. | 257/239 |
| 4,711,857 | 12/1987 | Cheng | 437/3 |
| 4,904,607 | 2/1990 | Riglet et al. | 437/3 |
| 5,120,664 | 6/1992 | Murotani | 437/2 |
| 5,236,871 | 8/1993 | Fossum et al. | 437/195 |

FOREIGN PATENT DOCUMENTS

| | | | |
|---|---|---|---|
| 58-141566 | 8/1983 | Japan | 257/234 |
| 59-214273 | 12/1984 | Japan | 257/257 |

*Primary Examiner*—Ngan V. Ngo
*Attorney, Agent, or Firm*—John H. Kusmiss; Thomas H. Jones; Guy M. Miller

[57] ABSTRACT

A monolithic semiconductor imager includes an indium-based III-V compound semiconductor monolithic active layer of a first conductivity type, an array of plural focal plane cells on the active layer, each of the focal plane cells including a photogate over a top surface of the active layer, a readout circuit dedicated to the focal plane cell including plural transistors formed monolithically with the monolithic active layer and a single-stage charge coupled device formed monolithically with the active layer between the photogate and the readout circuit for transferring photo-generated charge accumulated beneath the photogate during an integration period to the readout circuit. The photogate includes thin epitaxial semiconductor layer of a second conductivity type overlying the active layer and an aperture electrode overlying a peripheral portion of the thin epitaxial semiconductor layer, the aperture electrode being connectable to a photogate bias voltage.

19 Claims, 2 Drawing Sheets

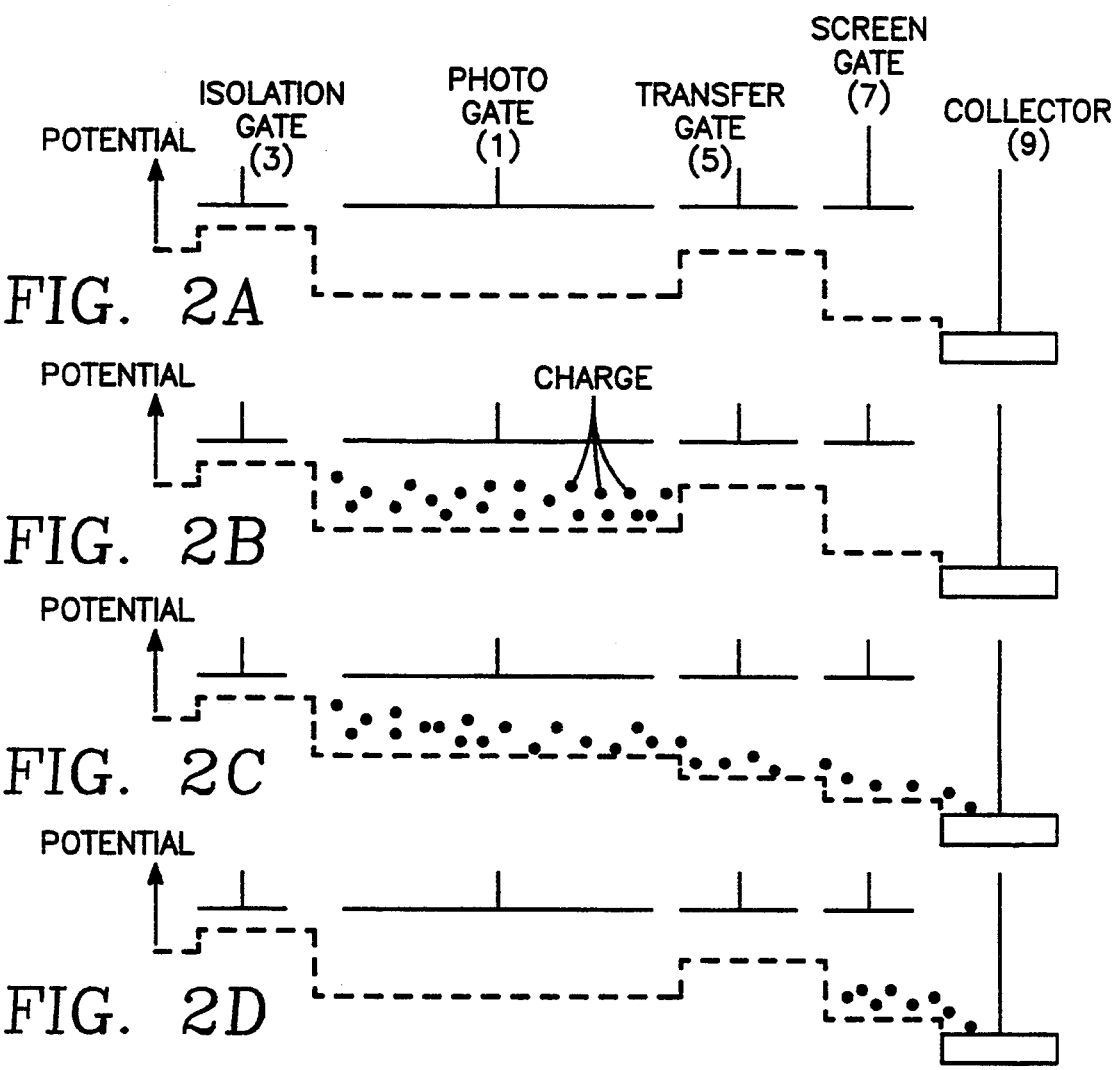
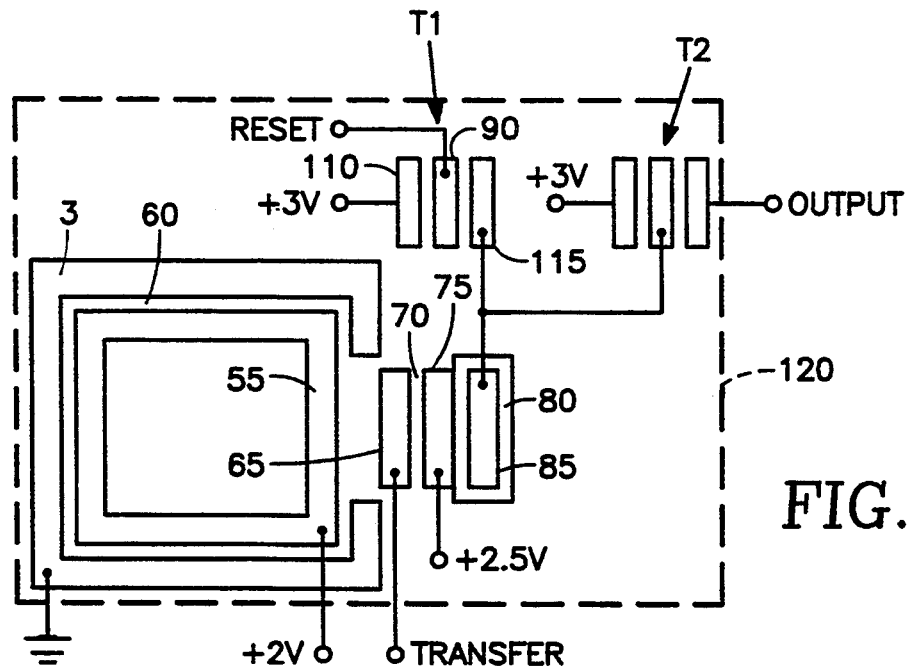

MONOLITHIC IN-BASED III-V COMPOUND SEMICONDUCTOR FOCAL PLANE ARRAY CELL WITH SINGLE STAGE CCD OUTPUT

ORIGIN OF THE INVENTION

The invention described herein was made in the performance of work under a NASA contract, and is subject to the provisions of Public Law 96-517 (35 USC 202) in which the Contractor has elected not to retain title.

BACKGROUND OF THE INVENTION

1. Technical Field

The invention is related InGaAs photodetectors and in particular to a monolithic InGaAs focal plane array detector responsive to light in the visible and short wavelength infrared wavelength range.

2. Background Art

InGaAs detectors enjoy a dual advantage of being able to operate at relatively high temperatures and of being able to detect short wavelength infrared light as well as visible light. Typically, InGaAs imagers assume a hybrid structure in which the InGaAs photodetector array is indium-bump bonded to an underlying substrate (e.g., silicon) containing the readout electronics.

An exciting prospect offered by the present invention in the development of InGaAs infrared detectors is the possibility of fabricating a truly monolithic short wavelength infrared focal plane array with high detectivity. Integration of the readout with the photodetector has worked in silicon, but attempts at monolithic mercury cadmium telluride focal plane arrays have met with limited success at best. A monolithic focal plane array has several advantages over hybrid structures. The focal plane size is not limited by thermal matching considerations, so that very large sensors, such as those realized in monolithic silicon CCDs, are possible. If a monolithic InGaAs focal plane array can be made (as in the present invention), then the indium bump process and associated hybrid structure is eliminated.

A further advantage is that a truly monolithic InGaAs focal plane would have immediate wide usage and application based upon the enormous growth and investment of the optoelectronics integrated circuit industry in InGaAs technology. The demand for InGaAs diode lasers, high speed detectors and light modulators for fiber optic communications in the 1.3–1.66 micron range has grown in recognition of the advantages of InGaAs over other semiconductors.

A further advantage is that the manufacturability of InGaAs infrared focal plane array is much greater than that of equivalent mercury cadmium telluride arrays, due to several factors: (a) the advanced state of growth techniques for III-V compound semiconductors, including molecular beam epitaxy, metal-organic chemical vapor deposition, liquid phase epitaxy, hydride-transport vapor phase epitaxy and atomic layer epitaxy. Another advantage is the higher quality of III-V compound semiconductor substrates and their more rugged nature, tending to lead to processing yield increases over II-VI compound semiconductors.

However, monolithic InGaAs focal plane arrays are not generally known in the art. One related structure is an optical pulse detector disclosed in U.S. Pat. No. 4,904,607 to Riglet et al. This patent discloses a monolithic integrated circuit containing an InGaAs photodetector and output circuitry consisting of InGaAs junction field effect transistors (JFETs). The principal function of the JFET output circuitry is to widen the extremely narrow pulse produced by the photodetector upon receipt of an equally narrow optical pulse. In this process, the amplitude (photon flux) of the received optical pulse is not measured, and there is no integration of photon-generated carriers in the sense that a focal plane imager integrates photon-generated carriers during successive integration periods.

Thus, what is needed is a monolithic integrated indium (In)-based III-V compound semiconductor focal plane array including readout circuitry.

SUMMARY OF THE DISCLOSURE

A monolithic semiconductor imager includes an indium-based III-V compound semiconductor monolithic active layer of a first conductivity type, an array of focal plane cells on the active layer, each of the focal plane cells including a photogate over a top surface of the active layer, a readout circuit dedicated to the focal plane cell including plural transistors formed monolithically with the monolithic active layer and a single-stage charge coupled device formed monolithically with the active layer between the photogate and the readout circuit for transferring photo-generated charge accumulated beneath the photogate during an integration period to the readout circuit. The photogate includes thin epitaxial semiconductor layer of a second conductivity type overlying the active layer and an aperture electrode overlying a peripheral portion of the thin epitaxial semiconductor layer, the aperture electrode being connectable to a photogate bias voltage.

In a preferred implementation, the photogate further includes an etched opening extending through a portion of the active layer and surrounding the aperture electrode to isolate the photogate. The single stage CCD preferably includes a transfer gate electrode overlying the active layer adjacent the photogate and connectable to a transfer control signal, a collector on the active layer and connectable to a collector bias voltage, and a screen gate electrode overlying the active layer between the transfer gate electrode and the collector and connectable to a screen gate bias voltage. Preferably, thin epitaxial semiconductor layers of the second conductivity type underlying respective ones of the electrodes and overlying the active layer. Preferably, the collector includes a collector electrode contacting the active layer. In a preferred implementation, a first one of the transistors includes a field effect reset transistor having a source connected to the collector, a drain connectable to a reset voltage and a gate connectable to a reset control signal, and a second one of the transistors includes a field effect output transistor having a gate connected to the collector, a drain connectable to a bias voltage and a source constituting an output node of the cell. Preferably, the reset transistor and the output transistor are each a junction field effect transistor whose source and drain include source and drain electrodes contacting the active layer and whose gate includes a gate electrode overlying the active layer between the source and drain electrodes. Preferably, a thin epitaxial layer of the second conductivity type lies between the gate electrode and the active layer. Preferably, the photogate bias voltage is sufficient to produce a first potential well of a first depth under the photogate, the screen gate bias voltage is sufficient to produce a second potential well of a second depth greater than the first depth under the screen gate, the reset voltage is sufficient to produce a third potential well of a third depth greater than the second depth under the collector. The transfer signal has a first state sufficient to produce a potential barrier relative to the first potential well during an integration period and a second state in which the potential barrier relative to the first potential well is removed. Preferably, an isolation electrode surrounds at least a portion of the photogate and connectable to an isolation voltage sufficient to produce a potential barrier at least partially surrounding the photogate.

BRIEF DESCRIPTION OF THE DRAWINGS

FIGS. 2A, 2B, 2C and 2D are chronologically successive diagrams of the electric potential of the structure of FIG. 1 illustrating the single stage CCD operation of the invention.

FIG. 4 is a plan view of the focal plane cell of FIG. 1.

DETAILED DESCRIPTION OF THE PREFERRED EMBODIMENTS

Figure 1:
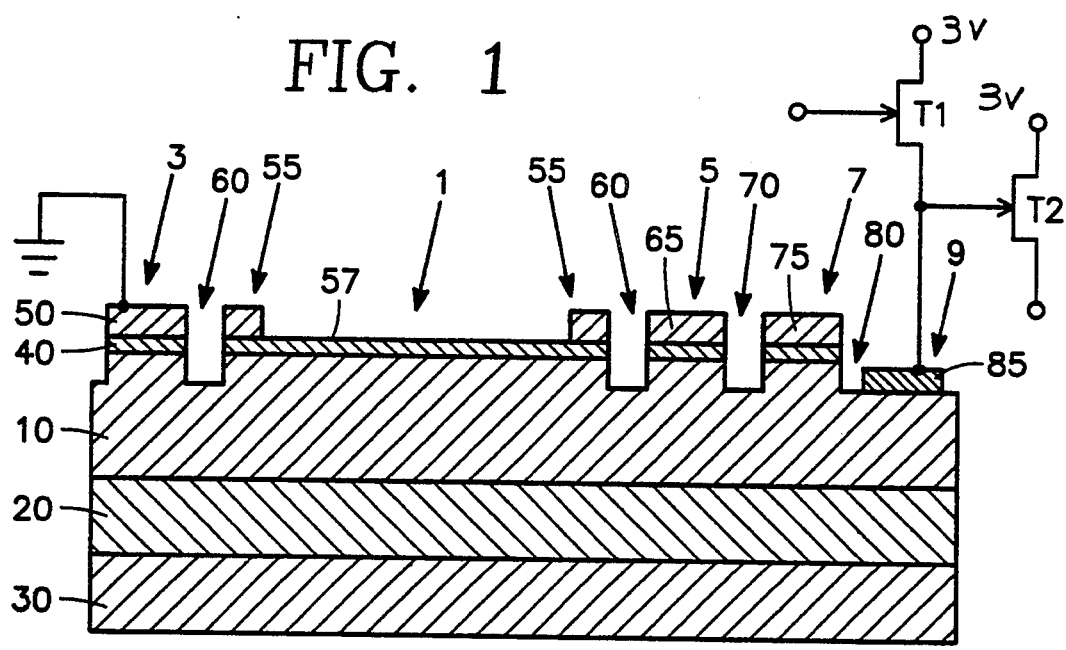
FIG. 1 is a cut-away side view of one cell of an In-based III-V compound semiconductor focal plane array embodying the present invention.

FIG. 1 illustrates a focal plane cell embodying the present invention. Photons entering through a photogate 1 generate charge which is collected in a potential well under the photogate 1 bounded by a potential barrier under an isolation gate 3. A transfer gate 5 and a screen gate 7 operate in the manner of a single CCD stage to transfer the charge collected under the photogate 1 at the end of an integration period to a potential well under a collector 9. The resulting change in potential of the collector 9 provides a precise measure of the amount of charge collected under the photogate 1 during the preceding integration period.

The collector 9 is connected to the source of a reset transistor T1 and to the gate of an output transistor T2. The drains of the two transistors T1, T2 are connected to a +3 volt D.C. supply source. A reset signal applied to the gate of the reset transistor T1 resets the potential of the collector 9 to +3 volts at the beginning of each integration period. The output of the cell is the source of the output transistor T2.

The single stage CCD operation of the cell of FIG. 1 is illustrated in the sequence of FIGS. 2A through 2D showing the change in the potentials beneath the various gates 1, 3, 5, 7 and beneath the collector 9. Throughout this sequence, the isolation gate 3 is constantly held at ground potential (i.e., 0 volts), the photogate 1 is constantly held at a potential of +2 volts while the screen gate 7 is constantly held at a potential of about +2.5 volts.

Initially, at the beginning of the integration period, the collector 9 is reset to +3 volts by the reset signal applied to the gate of the reset transistor T1 while the transfer gate is held at +0.5 volts. As shown in FIG. 2A, this forms a potential well beneath the photogate 1. During the ensuing integration period, photons incident on the top surface of the photogate 1 produce charge carriers which are collected in the potential well beneath the photogate 1 as shown in FIG. 2B. At the end of the integration period, the potential on the transfer gate is increased to +2.25 volts, thereby creating the staircase surface potential illustrated in FIG. 2C under the photogate 1 at +2 volts (the highest potential of the staircase), the transfer gate 5 at +2.25 volts, the screen gate 7 at +2.5 volts and the collector 9 at +3 volts (the lowest potential of the staircase). As indicated in FIG. 2C, this causes the charge accumulated under photogate to flow packet of charge to the potential well under the collector 9 in the manner of a charge coupled device. This charge transfer process is completed by returning the transfer gate 5 to its initial potential of +0.5 volts, as indicated in FIG. 2D. At this point all of the accumulated charge has been transferred under the collector 9, so that the charge may be measured by sensing the voltage at the source of the output transistor T2.

The underlying semiconductor structure includes an n-type epitaxial InGaAs active layer 10 formed over an epitaxial p-type InGaAs layer 20 overlying an InP substrate 30. The purpose of the p-type layer 20 is to limit the depth of potential wells beneath the various gates 1, 3, 5, 7 and the collector 9. A very thin epitaxial p+ InGaAs layer 40 is formed over the active layer 30. Subsequent to the formation of the p+ layer 40, a metal layer 50 is deposited over the structure.

The photogate 1 includes a metal aperture electrode 55 photolithographically defined from the metal layer 50 defining an aperture 57 therethrough and further includes that portion of the p+ layer 40 lying within the aperture 57 defined by the metal aperture electrode 55. The photogate 1 is bounded by an etched opening 60 surrounding the metal aperture 55 and isolating the portion of the p+ layer 40 constituting the photogate 1. The transfer gate 5 includes a metal transfer electrode 65 photolithographically defined from the metal layer 50. The transfer gate 5 is bounded by the etched opening 60 separating the transfer gate 5 from the photogate 1 and by an etched opening 70 separating the transfer gate 5 from the screen gate 7. The screen gate 7 includes a metal screen electrode 75 photolithographically defined from the metal layer 50. The screen gate 7 is bounded on one side by the etched opening 70 and on the opposite side by a depressed plane 80. The etched openings 60, 70 and the depressed plane 80 are formed by etching through the p+ layer 40 and a portion of the active layer 10 prior to the deposition of the metal layer 50. The collector 9 constitutes a collector electrode 85 photolithographically defined on the depressed plane 80 from the metal layer 50. The electric potentials discussed above with reference to FIGS. 2A through 2D are applied to respective ones of the electrodes 55, 65, 75 and 85.

Figure 3:
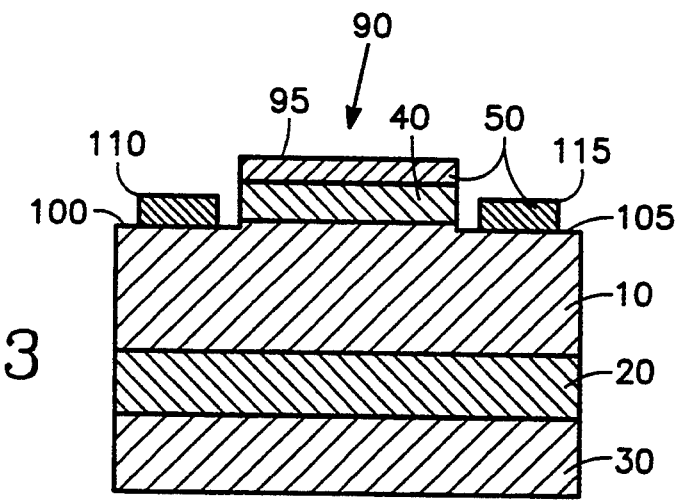
FIG. 3 is a cut-away side view of an In-based III-V compound semiconductor JFET fabricated in the monolithic integrated circuit of FIG. 1.

In order to form the transistors T1 and T2 monolithically with the semiconductor structure of FIG. 1, each of the transistors T1, T2 is a junction field effect transistor formed in the active layer 10 of FIG. 1 with the same p+ layer 40 and metal layer 50, in the manner shown in FIG. 3. Referring to FIG. 3, each one of the JFET transistors T1, T2 has a gate 90 including a metal gate electrode 95 formed over the p+ layer 40 and bounded by a pair of depressed planes 100, 105 on which are deposited respective source and drain electrodes 110, 115 directly on the active layer 10.

Figure 5:
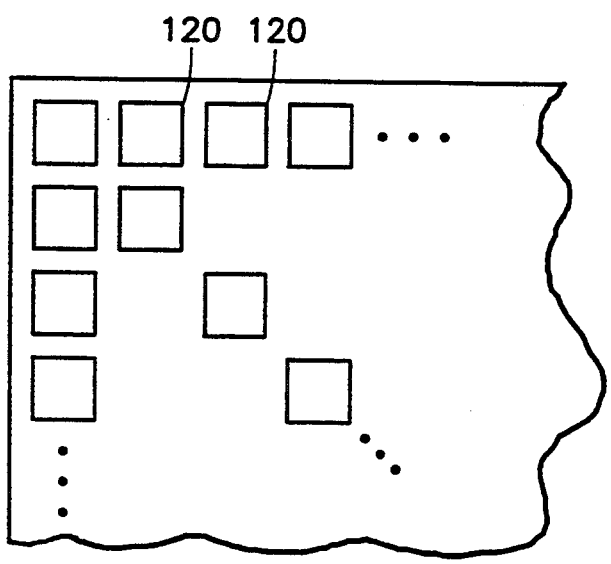
FIG. 5 is a plan view of a monolithic In-based III-V compound semiconductor focal plane array having plural cells of the type illustrated in FIG. 4.

FIG. 4 is a plan view of a focal plane cell 120 of the type described above with reference to FIG. 1 and including the JFET transistors T1 and T2. FIG. 5 is a plan view of a focal plane array consisting of plural rows and columns of focal plane cells 120. Some of the electrical connections are indicated as simple lines for the sake of clarity.

In one implementation, the substrate 30 is p-type InP and is between 200 ad 300 microns in thickness. The epitaxial layer 20 is p-type InGaAs doped with $10^{16}$ atoms per cubic centimeter of Zn (or other suitable p-type impurity) and is about 0.5 microns thick. The active layer 10 is n-type InGaAs doped with $10^{15}$ atoms per cubic centimeter of silicon (or other suitable n-type impurity) and is between about 1 and 2 microns in thickness.

The p+ layer 40 is epitaxially grown p-type InGaAs with on the order of $10^{18}$ atoms per cubic centimeter of a p-type impurity, and is between about 100 and 1000 angstroms thick. The thinness of the p+ layer 40 relative to the photon absorption depth controls the short wavelength cutoff of the detector, and should be as thin as possible (a few hundred angstroms) in order to extend the response through the visible wavelength region and through the near ultraviolet. The atomic percentage of In in the InGaAs active layer 10 determines the cutoff wavelength of the active layer 10, and in one implementation is 53%, corresponding to a cutoff wavelength of 1.7 microns.

The metal layer 50 is about 0.25 microns thick and is typically gold or gold-germanium-nickel. The photogate 1 is about 20 microns in width, the transfer gate 5, the screen gate 7 and the collector 9 are each about 2 microns in width while each of the etched openings 60 and 70 is about 1 micron in width. The integration time may be anywhere in the range of milliseconds to seconds, depending upon the dark current and the incident photon flux.

While the active layer 10 of FIG. 1 is InGaAs, the active layer 10 may be any suitable In-based III-V compound semiconductor. The substrate 30 is preferably indium phosphide but may instead be another suitable semiconductor material such as indium arsenide or gallium arsenide. The substrate material must be suitable for epitaxial growth of the intermediate p-type layer 20 and the n-type active layer 10 having a lattice constant and bandgap corresponding to the desired wavelength range of operation, as is well-known to those skilled in the art. Depending upon the lattice constant of the active layer, it may be desireable to add buffer layer of the type well-known to those skilled in the art between the substrate 30 and the p-type layer 20 where a maximum wavelength is desired.

While the invention has been described with reference to an implementation having particular dopant concentrations, layer thicknesses, feature sizes, applied voltages and certain conductivity types, the invention may be realized in other implementations with different dopant concentrations, layer thicknesses, feature sizes and applied voltages.

While the invention has been described in detail by specific reference to preferred embodiments, it is understood that variations and modifications thereof may be made without departing from the true spirit and scope invention.

What is claimed is:

1. A monolithic semiconductor imager comprising:
a monolithic active layer comprising an indium-based III-V compound semiconductor of a first conductivity type;
an array of focal plane cells on said active layer, each of said focal plane cells comprising:

(a) a photogate over a top surface of said active layer;
(b) a readout circuit dedicated to said focal plane cell comprising plural transistors formed monolithically with said monolithic active layer; and
(c) a single-stage charge coupled device formed monolithically with said active layer between said photogate and said readout circuit for transferring photo-generated charge accumulated beneath said photogate during an integration period to said readout circuit.

2. The imager of claim 1 wherein said photogate comprises:
a thin epitaxial semiconductor layer of a second conductivity type overlying said active layer;
an aperture electrode overlying a peripheral portion of said thin epitaxial semiconductor layer, said aperture electrode being connectable to a photogate bias voltage.

3. The imager of claim 2 wherein said photogate further comprises and etched opening extending through a portion of said active layer and surrounding said aperture electrode to isolate said photogate.

4. The imager of claim 1 wherein said single stage CCD comprises:
a transfer gate electrode overlying said active layer adjacent said photogate and connectable to a transfer control signal;
a collector on said active layer and connectable to a collector bias voltage; and
a screen gate electrode overlying said active layer between said transfer gate electrode and said collector and connectable to a screen gate bias voltage.

5. The imager of claim 4 further comprising thin epitaxial semiconductor layers of said second conductivity type underlying respective ones of said electrodes and overlying said active layer.

6. The imager of claim 5 wherein said collector comprises a collector electrode contacting said active layer.

7. The imager of claim 4 wherein:
a first one of said transistors comprises a field effect reset transistor having a source connected to said collector, a drain connectable to a reset voltage and a gate connectable to a reset control signal; and
a second one of said transistors comprises a field effect output transistor having a gate connected to said collector, a drain connectable to a bias voltage and a source constituting an output node of the cell.

8. The imager of claim 7 wherein said reset transistor and said output transistor are each a junction field effect transistor whose source and drain comprise source and drain electrodes contacting said active layer and whose gate comprises a gate electrode overlying said active layer between said source and drain electrodes.

9. The imager of claim 8 further comprising a thin epitaxial layer of said second conductivity type between said gate electrode and said active layer.

10. The imager of claim 7 wherein said photogate bias voltage is sufficient to produce a first potential well of a first depth under said photogate, said screen gate bias voltage is sufficient to produce a second potential well of a second depth greater than said first depth under said screen gate, said reset voltage is sufficient to produce a third potential well of a third depth greater than said second depth under said collector.

11. The imager of claim 10 wherein said transfer signal has a first state sufficient to produce a potential barrier relative to said first potential well during an integration period and a second state in which said potential barrier relative to said first potential well is removed.

12. The imager of claim 11 wherein said first and second conductivity types are n and p, respectively and wherein said potential well correspond to positive voltages.

13. The imager of claim 12 wherein said III-V compound semiconductor is GaAs, whereby said active layer comprises InGaAs.

14. The imager of claim 13 wherein said thin epitaxial layer is between about 100 and 1000 angstroms thick and wherein said imager is responsive in the shortwave infrared and visible wavelength region.

15. The imager of claim 1 wherein said photogate is on the order of 20 microns in extent.

16. The imager of claim 13 wherein said thin epitaxial layer of said photogate comprises InGaAs doped with on the order of about $10^{18}$ atoms per cubic centimeter of a p-type impurity and said active layer comprises InGaAs doped with on the order of about $10^{15}$ atoms per cubic centimeter of an n-type impurity.

17. The imager of claim 1 further comprising an isolation electrode surrounding at least a portion of said photogate and connectable to an isolation voltage sufficient to produce a potential barrier at least partially surrounding said photogate.

18. The imager of claim 1 wherein said active layer comprises on the order of about 53% indium.

19. The imager of claim 3 further comprising:
(a) a substrate underlying said active layer; and,
(b) an intermediate monolithic layer of said second conductivity type between said substrate and said active layer.

* * * * *